United States Patent
Jang et al.

(10) Patent No.: US 10,205,111 B2
(45) Date of Patent: Feb. 12, 2019

(54) ORGANIC LIGHT EMITTING DIODE, METHOD FOR MANUFACTURING ORGANIC LIGHT EMITTING DIODE, AND METHOD FOR REPAIRING ORGANIC LIGHT EMITTING DIODE

(71) Applicant: LG DISPLAY CO., LTD., Seoul (KR)

(72) Inventors: Junhyuk Jang, Daejeon (KR); Yeon Keun Lee, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/531,258

(22) PCT Filed: Oct. 6, 2015

(86) PCT No.: PCT/KR2015/010553
§ 371 (c)(1),
(2) Date: May 26, 2017

(87) PCT Pub. No.: WO2016/085111
PCT Pub. Date: Jun. 2, 2016

(65) Prior Publication Data
US 2017/0331063 A1    Nov. 16, 2017

(30) Foreign Application Priority Data

Nov. 27, 2014  (KR) .................. 10-2014-0167829

(51) Int. Cl.
*H01L 51/50*    (2006.01)
*H01L 51/56*    (2006.01)
(Continued)

(52) U.S. Cl.
CPC ........ *H01L 51/442* (2013.01); *H01L 51/5268* (2013.01); *H01L 51/56* (2013.01);
(Continued)

(58) Field of Classification Search
CPC . H01L 51/5268; H01L 51/5092; H01L 51/56; H01L 51/442; H01L 51/5072; H01L 51/568; Y02E 10/549
See application file for complete search history.

(56) References Cited

U.S. PATENT DOCUMENTS 8,698,134 B2    4/2014  Kim et al.
2004/0160167 A1*  8/2004  Arai ..................... G09G 3/006
                                                         313/500
(Continued)

FOREIGN PATENT DOCUMENTS

JP    2004-214084 A    7/2004
JP    2005-301084 A    10/2005
(Continued)

*Primary Examiner* — Caridad Everhart
(74) *Attorney, Agent, or Firm* — Birch, Stewart, Kolasch & Birch, LLP

(57) ABSTRACT

One embodiment of the present invention relates to an organic light emitting diode, a method for manufacturing an organic light emitting diode, and a method for repairing an organic light emitting diode, the light emitting diode comprising at least one exposed part on an upper electrode which exposes an organic layer or a lower electrode, wherein the light emitting diode effectively prevents performance deterioration or operation failure of the light emitting diode due to leakage current by removing an electrical passage in an area prone to short circuit flaws.

25 Claims, 4 Drawing Sheets

(51) Int. Cl.
*H01L 51/52* (2006.01)
*H01L 51/44* (2006.01)

(52) U.S. Cl.
CPC ...... *H01L 51/5072* (2013.01); *H01L 51/5092* (2013.01); *H01L 2251/568* (2013.01); *Y02E 10/549* (2013.01)

(56) References Cited

U.S. PATENT DOCUMENTS

| | | | | |
|---|---|---|---|---|
| 2006/0183254 | A1* | 8/2006 | Yamazaki | G09G 3/006 438/4 |
| 2008/0251780 | A1* | 10/2008 | Li | B82Y 10/00 257/13 |
| 2013/0334506 | A1* | 12/2013 | Tobise | H01L 51/5268 257/40 |
| 2016/0308167 | A1* | 10/2016 | Park | H01L 51/5225 |
| 2018/0046053 | A1* | 2/2018 | Rozbicki | G02F 1/1523 |

FOREIGN PATENT DOCUMENTS

| | | |
|---|---|---|
| KR | 10-2010-0020724 A | 2/2010 |
| KR | 10-2012-0055534 A | 5/2012 |
| KR | 10-2014-0029057 A | 3/2014 |

\* cited by examiner

[Figure 1]
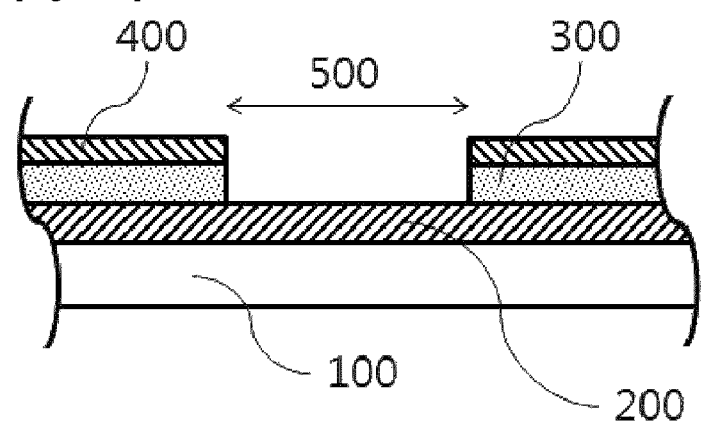
[Figure 2]
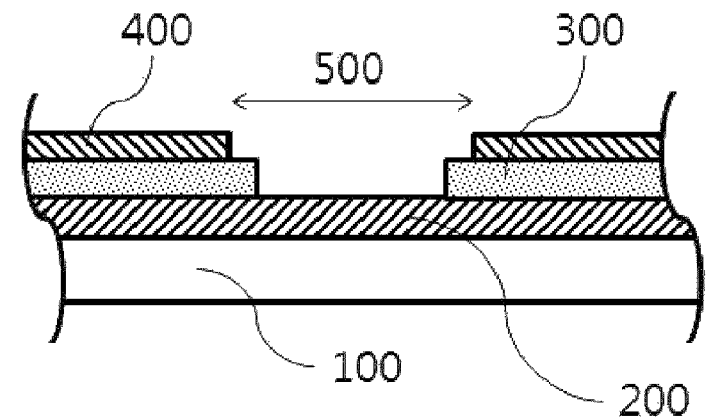

[Figure 3]
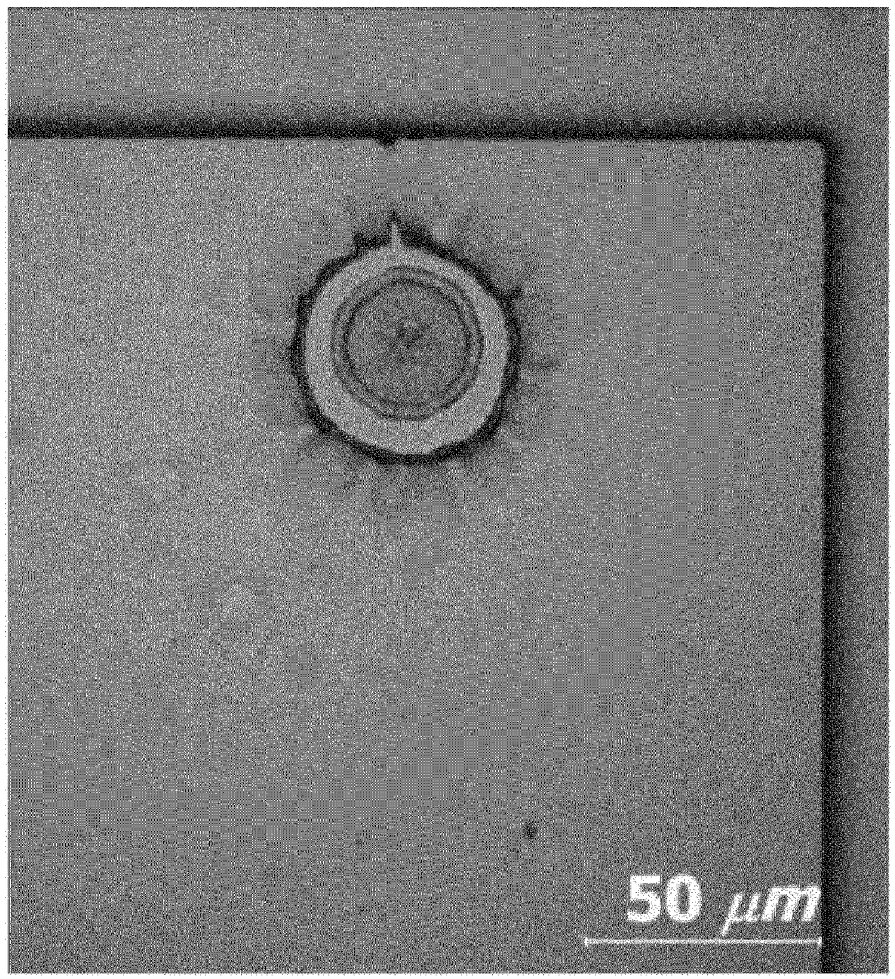

[Figure 4]
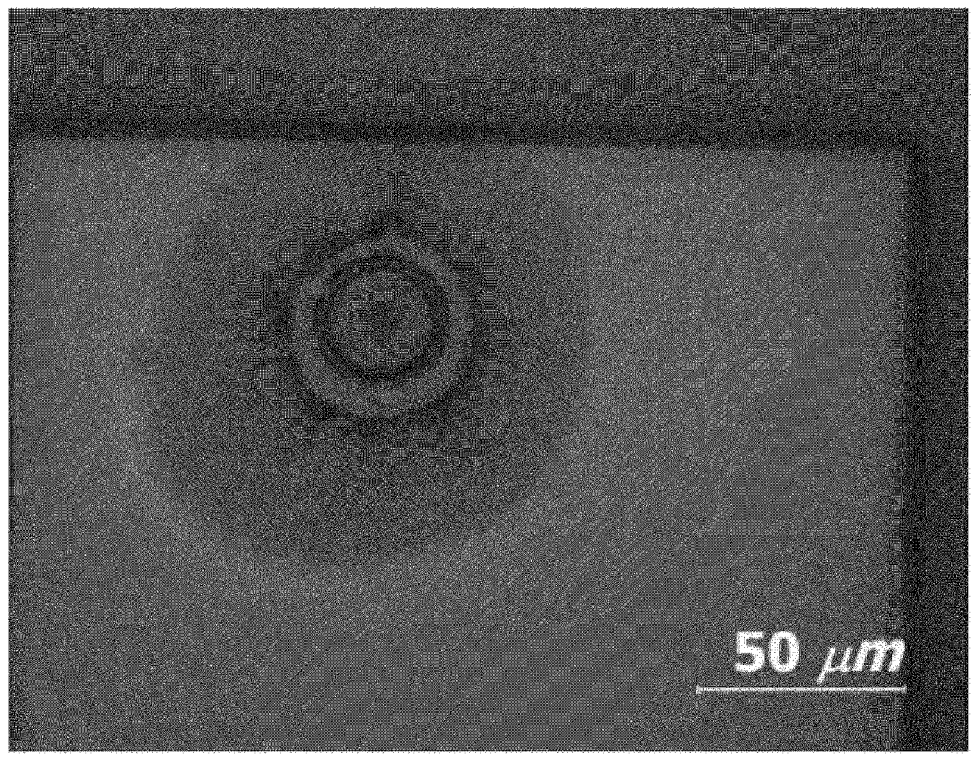
[Figure 5]
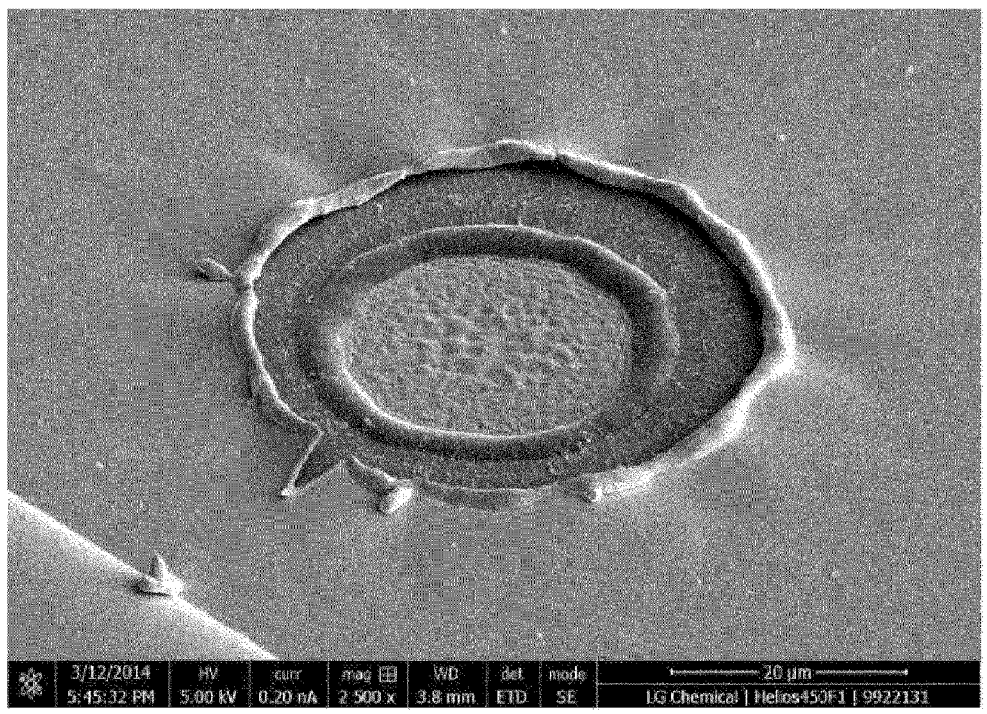

[Figure 6]
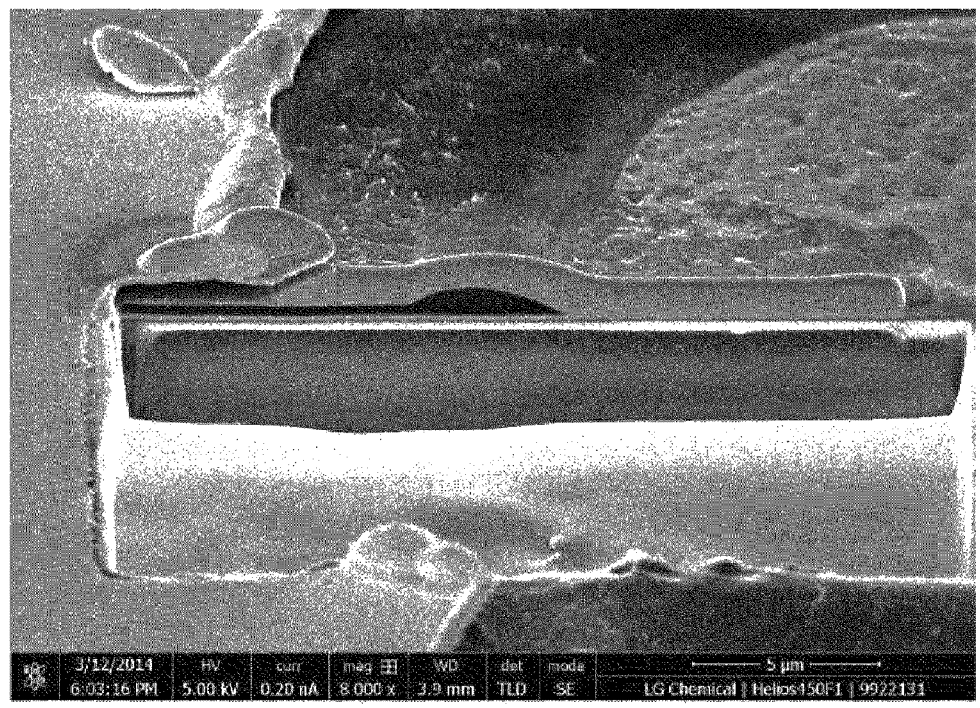
[Figure 7]
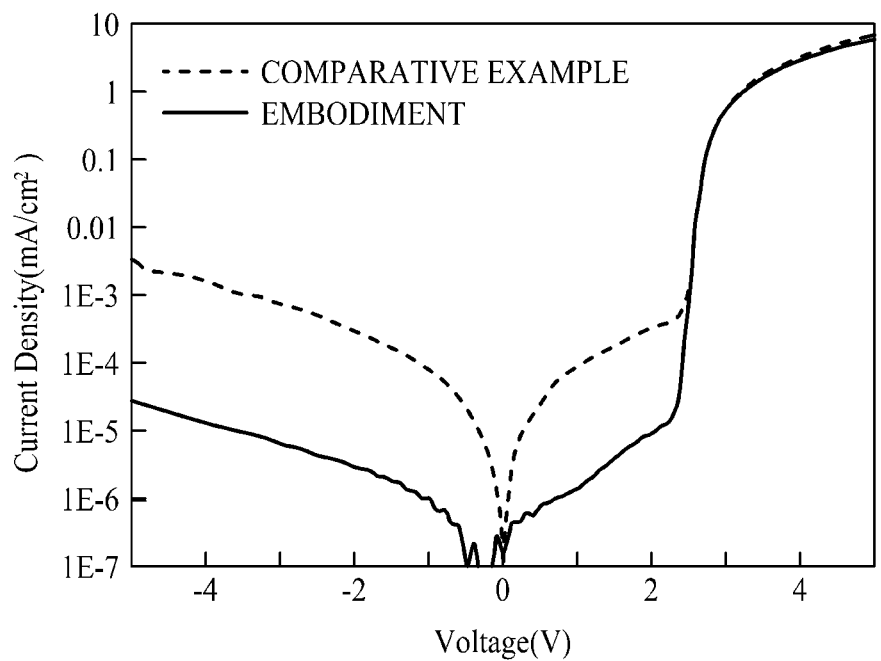

ORGANIC LIGHT EMITTING DIODE, METHOD FOR MANUFACTURING ORGANIC LIGHT EMITTING DIODE, AND METHOD FOR REPAIRING ORGANIC LIGHT EMITTING DIODE

CROSS REFERENCE TO RELATED APPLICATIONS

This application is the National Phase of PCT International Application No. PCT/KR2015/010553, filed on Oct. 6, 2015, which claims priority under 35 U.S.C. 119(a) to Patent Application No. 10-2014-0167829, filed in Republic of Korea on Nov. 27, 2014, all of which are hereby expressly incorporated by reference into the present application.

TECHNICAL FIELD

The present specification provides an organic light emitting device, a method of manufacturing the same, and a method of repairing the same.

BACKGROUND ART

An organic light emitting phenomenon denotes a phenomenon where electrical energy is converted into light energy by using an organic material. That is, in a case where an organic material layer is disposed between an anode and a cathode, when a voltage is applied between the anode and the cathode, the anode injects a hole into the organic material layer, and the cathode injects an electron into the organic material layer. The hole and the electron which are injected into the organic material layer are combined to generate an exciton, and when the exciton is shifted to a ground state, light is emitted.

Since an interval between the anode and the cathode is small, an organic light emitting device is easy to have a short circuit defect. Due to a pin hole, a crack, a step in a structure of the organic light emitting device, and a roughness of coating, the anode may directly contact the cathode, or a thickness of an organic material layer may be further thinned in those defect regions. The defect regions provide a low-resistance path in order for a current to flow, thereby allowing the current to hardly flow or allowing the current not to flow through the organic light emitting device at all in an extreme case. For this reason, an output of light emitted from the organic light emitting device is reduced or removed. In a multi-pixel display device, a short circuit defect causes a dead pixel which does not emit light or emits light having a light intensity less than an average light intensity, causing the degradation in display quality. For illumination or a low resolution, a large portion of a corresponding region cannot operate due to the short circuit defect. Due to concern about the short circuit defect, manufacturing of the organic light emitting device is conventionally performed in a clean room. However, the short circuit defect cannot be effectively removed even in a clean environment. In many cases, in order to decrease the number of short circuit defects by increasing an interval between two electrodes, a thickness of the organic material layer more increases than a thickness actually necessary for operating a device. Such a method additionally increases the manufacturing cost of the organic light emitting device, and moreover, cannot completely remove the short circuit defect.

DISCLOSURE

Technical Problem

The present specification provides an organic light emitting device, a method of manufacturing the same, and a method of repairing the same. In detail, the present specification provides an organic light emitting device in which a short circuit defect region is removed and a method of manufacturing the same, and moreover, provides a method of repairing an organic light emitting device including a short circuit defect region.

Technical Solution

An aspect of the present specification provides an organic light emitting device including: a bottom electrode; a top electrode provided opposite to the bottom electrode; and a one or more-layered organic material layer provided between the bottom electrode and the top electrode, characterized in that the top electrode is a metal electrode including Ag, and the top electrode includes an exposure portion where the organic material layer or the bottom electrode is exposed, the exposure portion being provided as one or more.

An aspect of the present specification provides a method of manufacturing an organic light emitting device including: preparing a bottom electrode; forming a one or more-layered organic material layer on the bottom electrode; forming a top electrode on the organic material layer; and connecting the bottom electrode and the top electrode to an external power source and applying a reverse voltage to remove one or more regions of the top electrode including a short circuit defect region to form an exposure portion, wherein the top electrode comprises a metal electrode including Ag.

An aspect of the present specification provides a method of repairing an organic light emitting device including: preparing an organic light emitting device including a bottom electrode, a top electrode provided opposite to the bottom electrode, and a one or more-layered organic material layer provided between the bottom electrode and the top electrode, the top electrode being a metal electrode including Ag; connecting an external power source to the organic light emitting device; and applying a reverse voltage to the organic light emitting device to remove one or more regions of the top electrode including a short circuit defect region to form an exposure portion.

An aspect of the present specification provides a display device including the organic light emitting device.

An aspect of the present specification provides a lighting device including the organic light emitting device.

Advantageous Effect

In an organic light emitting device according to an embodiment of the present specification, since a short circuit defect region is removed, problems of a performance and a shortened lifetime of the organic light emitting device caused by a leakage current can be minimized.

An organic light emitting device according to an embodiment of the present specification includes a metal electrode including Ag, thereby realizing high efficiency.

A method of repairing an organic light emitting device according to an embodiment of the present specification is a simple method and can repair a short circuit defect region of the organic light emitting device.

DESCRIPTION OF DRAWINGS

FIGS. 1 and 2 illustrate a cross-sectional surface of an organic light emitting device according to an embodiment of the present specification.

FIG. 3 illustrates an exposure region of an organic light emitting device according to an embodiment of the present specification and is a microscope image observed from a top electrode of the organic light emitting device.

FIG. 4 illustrates an exposure region and a light emitting state of an organic light emitting device according to an embodiment of the present specification and is a microscope image observed from a bottom electrode of the organic light emitting device.

FIG. 5 illustrates an exposure region of an organic light emitting device according to an embodiment of the present specification and is a scanning electron microscope image observed from a top electrode.

FIG. 6 illustrates a scanning electron microscope image obtained by observing a cross-sectional surface of an exposure region of an organic light emitting device according to an embodiment of the present specification.

FIG. 7 is a graph showing voltage-current density characteristics of a comparative example and an organic light emitting device according to an embodiment.

BEST MODE FOR INVENTION

In the present specification, when one member is referred to as being disposed "on" another member, this includes a case where the one member contacts the other member and a case where another member is provided between two members.

In the present specification, when it is described that one includes some elements, it should be understood that it may include only those elements, or it may include other elements as well as those elements if there is no specific limitation.

Hereinafter, the present specification will be described in more detail.

An aspect of the present specification provides an organic light emitting device including: a bottom electrode; a top electrode provided opposite to the bottom electrode; and a one or more-layered organic material layer provided between the bottom electrode and the top electrode, characterized in that the top electrode is a metal electrode including Ag, the top electrode includes an exposure portion where the organic material layer or the bottom electrode is exposed, and the exposure portion is provided as one or more.

According to an aspect of the present specification, the exposure portion may be a region where a lower organic material layer or the bottom electrode is exposed. Also, according to an aspect of the present specification, the exposure portion may be a region where the top electrode is not partially provided. Also, according to an aspect of the present specification, the exposure portion may be a region where the top electrode in a short circuit defect region of a pixel part of the organic light emitting device is removed.

The organic material layer may be transparent or semi-transparent, and thus, the bottom electrode may be observed through the organic material layer.

According to an aspect of the present specification, at least one region of the organic material layer in the exposure portion may be removed.

According to an aspect of the present specification, a region corresponding to an area smaller than an area of the exposure portion may be removed from the organic material layer in the exposure portion.

According to an aspect of the present specification, a thickness of the top electrode in at least one region of an edge of the exposure portion may be 110% or more of a thickness of the top electrode in a non-exposure portion. In detail, according to an aspect of the present specification, a shape of the edge of the exposure portion in addition to the exposure portion may be a crater shape or caldera shape. According to an aspect of the present specification, the shape of the edge of the exposure portion may be a shape which is provided by the top electrode passing through the exposure portion in a direction from the bottom electrode to the top electrode.

FIGS. 1 and 2 illustrate a cross-sectional surface of an organic light emitting device according to an embodiment of the present specification. In detail, FIGS. 1 and 2 illustrate a cross-sectional surface of a region where an exposure portion 500 is provided, in an organic light emitting device where a substrate 100, a bottom electrode 200, an organic material layer 300, and a top electrode 400 are sequentially provided.

According to an aspect of the present specification, a shape of the exposure portion may be circular, elliptical, or a closed figure where a straight line and a curve are provided.

According to an aspect of the present specification, a thickness of the organic material layer in the exposure portion outside the removed region may be 110% or more of a thickness of the organic material layer in a region outside the exposure portion.

According to an aspect of the present specification, a shape of the removed organic material layer may be circular, elliptical, or a closed figure where a straight line and a curve are provided.

According to an aspect of the present specification, a content of Ag in the top electrode may be 90 wt % or more of a total weight of the top electrode.

According to an aspect of the present specification, the top electrode may be a metal electrode where a main material is Ag.

According to an aspect of the present specification, a region corresponding to the exposure portion may be electrically cut off. In detail, a region of the organic light emitting device corresponding to the exposure portion may be a region including the short circuit defect region, and since the top electrode is removed, a leakage current flowing to the short circuit defect region may be cut off.

According to an aspect of the present specification, the organic light emitting device may further include a substrate, and the bottom electrode may be provided on the substrate.

According to an aspect of the present specification, the bottom electrode denotes an electrode which is provided closer to the substrate than the top electrode.

According to an aspect of the present specification, a maximum diameter of the exposure portion is 500 nm or more and 1 mm or less.

According to an aspect of the present specification, a maximum diameter of the bottom electrode exposed by the exposure portion may be 200 nm or more and 200 μm or less.

An aspect of the present specification provides a method of manufacturing an organic light emitting device including: preparing a bottom electrode; forming a one or more-layered organic material layer on the bottom electrode; forming a top electrode on the organic material layer; and connecting the bottom electrode and the top electrode to an external power source and applying a reverse voltage to remove one or more regions of the top electrode including a short circuit defect region to form an exposure portion, wherein the top electrode comprises a metal electrode including Ag.

A short circuit defect can occur when an excessive electric field is applied between the bottom electrode and the top electrode due to a defect of a raw material of the organic light emitting device, the top electrode directly contacting the bottom electrode in a manufacturing process or in use, or a reduction or a degeneration in thickness of the organic material layer disposed between the bottom electrode and the top electrode. When the short circuit defect occurs, a resistance between the bottom electrode and the top electrode is reduced, thereby decreasing a current flowing to a normal region of the organic light emitting device and increasing the amount of a leakage current flowing to a short circuit point. This can decrease a power efficiency of the organic light emitting device, and in a considerable case, the organic light emitting device cannot operate. Also, when a current which is distributed and flows to an organic material in a wide area concentrates on and flows in a point where the short circuit occurs, high heat occurs locally, and there is a risk where firing or explosion will occurs.

The forming of the exposure portion may remove an electrical path of a region where a short circuit defect region or a short circuit can occur, thereby preventing a performance of the organic light emitting device from being reduced by a leakage current or preventing the organic light emitting device from being inoperable due to a leakage current.

In the manufacturing method according to an aspect of the present specification, the reverse voltage may be a voltage between a breakdown voltage of the organic material layer in the short circuit defect region and a breakdown voltage of the organic material layer in a normal region.

In the present specification, for convenience of expression, the reverse voltage is expressed as an absolute value (a positive value) of a voltage.

The normal region may be a region which normally operates without the short circuit.

According to an aspect of the present specification, a breakdown voltage of the organic material layer may denote a voltage which allows the organic material layer from losing a function when the voltage is applied to an anode in a reverse direction via the organic material layer from a cathode. In detail, the short circuit defect region may be a region where a thickness of the organic material layer is thinner than a normal range, and thus, a level of an absolute value of the breakdown voltage of the organic material layer may be lower than the normal region.

According to an aspect of the present specification, the breakdown voltage of the organic material layer in the short circuit defect region may be 18 V or more. Alternatively, according to an aspect of the present specification, the breakdown voltage of the organic material layer in the short circuit defect region may be 20 V or more and 25 V or more.

According to an aspect of the present specification, the breakdown voltage of the organic material layer in the normal region may be 70 V or less or 50 V or less. In detail, according to an aspect of the present specification, the breakdown voltage of the organic material layer in the normal region may be 40 V or less.

In the manufacturing method according to an aspect of the present specification, the reverse voltage may be 18 V or more. In detail, in the manufacturing method according to an aspect of the present specification, the reverse voltage may be 20 V or more and 25 V or more.

Moreover, in the manufacturing method according to an aspect of the present specification, the reverse voltage may be 70 V or less or 50 V or less. In detail, in the manufacturing method according to an aspect of the present specification, the reverse voltage may be 40 V or less.

In the manufacturing method according to an aspect of the present specification, the reverse voltage may be 18 V or more or 70 V or less. In detail, in the manufacturing method according to an aspect of the present specification, the reverse voltage may be 20 V or more and 50 V or less.

According to an aspect of the present specification, the reverse voltage may be a reverse pulse voltage.

According to an aspect of the present specification, a pulse width of the reverse pulse voltage may be 10 ns or more and 10 ms or less. In detail, in the manufacturing method according to an aspect of the present specification, the pulse width of the reverse pulse voltage may be 1 μs or more and 10 ms or less. According to an aspect of the present specification, the pulse width of the reverse pulse voltage may be appropriately adjusted according to an emissive area and a thickness of the organic material layer, based on a case where an emissive area of the organic light emitting device is 100 mm×100 mm and the thickness of the organic material layer is 500 nm. Also, when the emissive area of the organic light emitting device and the thickness of the organic material layer are changed, the pulse width of the reverse pulse voltage may be appropriately adjusted within the range.

According to an aspect of the present specification, since a time can be expended in reaching a maximum voltage of the reverse pulse voltage due to RC delay, a time for which the maximum voltage is held may be less than a width of an applied pulse. Forming of the exposure portion may be adjusted based on a time when a continuous maximum voltage is applied in each unit of the reverse pulse voltage, and the exposure portion may be the most efficiently formed within a range where the continuous maximum voltage is held.

When the pulse width of the reverse pulse voltage is within the range, by minimally removing the top electrode in the short circuit defect region, the emissive area of the organic light emitting device can be maximally secured.

According to an aspect of the present specification, a pulse frequency of the reverse pulse voltage may be 100 Hz or more and 100 MHz or less. According to an aspect of the present specification, the pulse frequency of the reverse pulse voltage may be appropriately adjusted according to an emissive area and a thickness of the organic material layer, based on a case where an emissive area of the organic light emitting device is 100 mm×100 mm and the thickness of the organic material layer is 500 nm. Also, when the emissive area of the organic light emitting device and the thickness of the organic material layer are changed, the pulse frequency of the reverse pulse voltage may be appropriately adjusted within the range.

According to an aspect of the present specification, the reverse pulse voltage may be repeatedly applied 100 times or more or 1,000 times or more. According to an aspect of the present specification, the reverse pulse voltage may be repeatedly applied 100,000 times or less.

According to an aspect of the present specification, a maximum voltage of the reverse pulse voltage may sequentially increase.

Whenever the reverse pulse voltage is applied, an exposure portion may be formed in one short circuit defect region of the organic light emitting device. That is, when the short circuit defect region is provided in plurality, breakdown voltages of organic material layers in the respective short circuit defect regions may differ, and thus, the exposure portion may be formed in each of the short circuit defect regions by sequentially increasing the reverse voltage.

The organic light emitting device according to an aspect of the present specification may be manufactured by the manufacturing method.

An aspect of the present specification provides a method of repairing an organic light emitting device, the method comprising: preparing an organic light emitting device including a bottom electrode, a top electrode provided opposite to the bottom electrode, and a one or more-layered organic material layer provided between the bottom electrode and the top electrode, the top electrode being a metal electrode including Ag; connecting an external power source to the organic light emitting device; and applying a reverse voltage to the organic light emitting device to remove one or more regions of the top electrode including a short circuit defect region to form an exposure portion.

In the repairing method according to an aspect of the present specification, the reverse voltage may be a voltage between a breakdown voltage of the organic material layer in the short circuit defect region and a breakdown voltage of the organic material layer in a normal region. The breakdown voltage of the organic material layer in the short circuit defect region and the breakdown voltage of the organic material layer in the normal region are as described above.

In the repairing method according to an aspect of the present specification, the reverse voltage may be 18 V or more. In detail, in the repairing method according to an aspect of the present specification, the reverse voltage may be 20 V or more and 25 V or more.

Moreover, in the repairing method according to an aspect of the present specification, the reverse voltage may be 70 V or less or 50 V or less. In detail, in the repairing method according to an aspect of the present specification, the reverse voltage may be 40 V or less.

In the repairing method according to an aspect of the present specification, the reverse voltage may be 18 V or more and 70 V or less. In detail, in the repairing method according to an aspect of the present specification, the reverse voltage may be 20 V or more and 50 V or less.

In the repairing method according to an aspect of the present specification, the reverse voltage may be the reverse pulse voltage.

In the repairing method according to an aspect of the present specification, a pulse width of the reverse pulse voltage is 10 ns or more and 10 ms or less. In detail, in the repairing method according to an aspect of the present specification, the pulse width of the reverse pulse voltage may be 1 µs or more and 10 ms or less. According to an aspect of the present specification, the pulse width of the reverse pulse voltage may be appropriately adjusted according to an emissive area and a thickness of the organic material layer, based on a case where an emissive area of the organic light emitting device is 100 mm×100 mm and the thickness of the organic material layer is 500 nm. Also, when the emissive area of the organic light emitting device and the thickness of the organic material layer are changed, the pulse width of the reverse pulse voltage may be appropriately adjusted within the range.

In the repairing method according to an aspect of the present specification, since a time can be expended in reaching a maximum voltage of the reverse pulse voltage due to RC delay, a time for which the maximum voltage is held may be less than a width of an applied pulse. Forming of the exposure portion may be adjusted based on a time when a continuous maximum voltage is applied in each unit of the reverse pulse voltage, and the exposure portion may be the most efficiently formed within a range where the continuous maximum voltage is held.

When the pulse width of the reverse pulse voltage is within the range, by minimally removing the top electrode in the short circuit defect region, the emissive area of the organic light emitting device can be maximally secured.

In the repairing method according to an aspect of the present specification, a pulse frequency of the reverse pulse voltage may be 100 Hz or more and 100 MHz or less. According to an aspect of the present specification, the pulse frequency of the reverse pulse voltage may be appropriately adjusted according to an emissive area and a thickness of the organic material layer, based on a case where an emissive area of the organic light emitting device is 100 mm×100 mm and the thickness of the organic material layer is 500 nm. Also, when the emissive area of the organic light emitting device and the thickness of the organic material layer are changed, the pulse frequency of the reverse pulse voltage may be appropriately adjusted within the range.

In the repairing method according to an aspect of the present specification, the reverse pulse voltage may be repeatedly applied 100 times or more or 1,000 times or more. According to an aspect of the present specification, the reverse pulse voltage may be repeatedly applied 100,000 times or less.

In the repairing method according to an aspect of the present specification, a maximum voltage of the reverse pulse voltage may sequentially increase.

Whenever the reverse pulse voltage is applied, an exposure portion may be formed in one short circuit defect region of the organic light emitting device. That is, when the short circuit defect region is provided in plurality, breakdown voltages of organic material layers in the respective short circuit defect regions may differ, and thus, the exposure portion may be formed in each of the short circuit defect regions by sequentially increasing the reverse voltage.

In the repairing method according to an aspect of the present specification, details of the reverse voltage, the exposure portion, the reverse pulse voltage, the pulse width are as described above in the manufacturing method.

The organic light emitting device according to an aspect of the present specification may be an organic light emitting device repaired by the repairing method.

According to an aspect of the present specification, the substrate may be a substrate which is good in transparency, surface smoothness, treatability, and waterproof. In detail, a glass substrate, a thin film glass substrate, or a transparent plastic substrate may be used. The plastic substrate may include a film, which is provided as a single layer type or a multilayer type, such as polyethylene terephthalate (PET), polyethylene naphthalate (PEN), polyether ether ketone (PEEK), or polyimide (PI). Also, the substrate may include a light scattering function. However, the substrate is not limited thereto and may use a substrate which is commonly used in an organic light emitting device.

According to an aspect of the present specification, the bottom electrode may be a transparent electrode. When the bottom electrode is the transparent electrode, the bottom electrode may be conductive oxide such as indium tin oxide (ITO), indium zinc oxide (IZO), or the like. Furthermore, the bottom electrode may be a semitransparent electrode. When the bottom electrode is the semitransparent electrode, the bottom electrode may be manufactured with a semitransparent metal such as Ag, Au, Mg, Ca, or an alloy thereof. When the semitransparent metal is used as the bottom electrode, the organic light emitting device may have a micro-cavity structure.

According to an aspect of the present specification, the bottom electrode may be an anode, and the top electrode may be a cathode.

According to an aspect of the present specification, the bottom electrode may be a cathode, and the top electrode may be an anode.

According to an aspect of the present specification, the organic material layer may include a one or more-layered light emitting layer and may further include one or more layers selected from the group consisting of a hole injecting layer; a hole transporting layer; a hole blocking layer; a charge generating layer; an electron blocking layer; an electron transporting layer; and an electron injecting layer.

The charge generating layer denotes a layer which generates a hole and an electron when a voltage is applied thereto.

According to an aspect of the present specification, a material of the hole transporting layer is a material which receives a hole from the anode or the hole injecting layer and transports the hole to an emission layer, and a material which is high in mobility of holes is suitable for the material of the hole transporting layer. Detailed examples of the material of the hole transporting layer may include an arylamine-based organic material, a conductive polymer, and a block copolymer including conjugation and non-conjugation, but are not limited thereto.

According to an aspect of the present specification, a material of the light emitting layer is a material which combines a hole and an electron, respectively supplied from the hole transporting layer and the electron transporting layer, to emit visible light and may be a material which is good in quantum efficiency for fluorescence or phosphorescence. Detailed examples of the material of the emission layer may include 8-hydroxyquinoline aluminum complex ($Alq_3$); carbazole-based compounds; dimerized styryl compounds; BAlq; BAlq; 10-hydroxybenzo quinoline-metal compounds; benzoxazole, benzthiazole and benzimidazole series of compounds; poly (p-phenylene vinylene) (PPV) series polymer; spiro compounds; polyfluorene; and rubrene, but are not limited thereto.

According to an aspect of the present specification, a material of the electron transporting layer according to an embodiment of the present invention is a material which transports an electron, injected from the cathode, to the emission layer, and a material which is high in mobility of electrons is suitable for the material of the electron transporting layer. Detailed examples of the material of the electron transporting layer may include 8-hydroxyquinoline aluminum complex; complex including $Alq_3$; organic radical compounds; hydroxyflavone-metal complex, but are not limited thereto.

In the present specification, a display device including the organic light emitting device is provided. In the display device, the organic light emitting device may act as a pixel or a backlight. In addition, elements well known to those skilled in the art may be applied to the display device.

In the present specification, a lighting device including the organic light emitting device is provided. In the lighting device, the organic light emitting device may act as an emission part. In addition, elements well known to those skilled in the art may be applied to the lighting device.

MODE FOR INVENTION

Hereinafter, exemplary embodiments of the present invention will now be described in detail. The invention may, however, be embodied in many different forms and should not be construed as being limited to the embodiments set forth herein; rather, these embodiments are provided so that this disclosure will be thorough and complete, and will fully convey the concept of the invention to those skilled in the art.

[Embodiment]

A secondary electrode using Al, a bottom anode using indium tin oxide (ITO), and an insulation layer using polyimide are sequentially formed on a glass substrate, and a pattern is formed in a portion requiring emission of light by using a photolithography process. In this case, an emissive area is 90 mm×90 mm. After the pattern is formed, a hole injecting layer, a hole transporting layer, a light emitting layer, an electron transporting layer, and an electron injecting layer are sequentially formed thereon by using a vacuum thermal evaporation process. A total thickness of a formed organic material layer is about 500 nm. A top cathode is formed of silver (Ag) to have a thickness of 150 nm, thereby manufacturing an organic light emitting device.

In a finished organic light emitting device, an anode is connected to a negative (−) electrode of an external power source, a cathode is connected to a positive (+) electrode, and a reverse voltage is applied to the organic light emitting device, thereby removing a short circuit defect region. Here, in a voltage applying condition, a maximum voltage of a reverse voltage having a pulse width of 30 μs sequentially increases at an interval of 0.5 V from 20 V to 32 V, and each voltage is repeatedly applied at an interval of 100 μs 20 times, thereby completing one cycle. The cycle is repeated 20 times, for completely removing the short circuit defect region.

As a result, a defect removing region having an Ag cathode exposure portion having a diameter of 50 μm to 200 μm is formed and may be checked through observation using an optical microscope or a scanning electron microscope.

FIG. 3 illustrates an exposure region of an organic light emitting device according to an embodiment of the present specification and is a microscope image observed from a top electrode of the organic light emitting device.

FIG. 4 illustrates an exposure region and a light emitting state of an organic light emitting device according to an embodiment of the present specification and is a microscope image observed from a bottom electrode of the organic light emitting device.

FIG. 5 illustrates an exposure region of an organic light emitting device according to an embodiment of the present specification and is a scanning electron microscope image observed from a top electrode.

FIG. 6 illustrates a scanning electron microscope image obtained by observing a cross-sectional surface of an exposure region of an organic light emitting device according to an embodiment of the present specification.

COMPARATIVE EXAMPLE

An organic light emitting device is manufactured through the same process as the embodiment except a process of applying a reverse voltage.

FIG. 7 is a graph showing voltage-current density characteristics of a comparative example and an organic light emitting device according to an embodiment. In detail, FIG. 7 is a graph showing a flowing current density when a voltage is applied to the organic light emitting device according to the embodiment and the comparative example. When the reverse voltage or a forward voltage lower than a threshold voltage is applied, a current flowing in the organic light emitting device may be treated as a leakage current flowing through a defect portion of a device. In comparison with the comparative example where the defect portion is not removed, it can be seen that in the embodiment which includes an opening because the defect portion is removed, a value of the leakage current has a low numerical value equal to or less than 1/100.

The invention claimed is:

1. An organic light emitting device including:
a bottom electrode;
a top electrode provided opposite to the bottom electrode; and
a one or more-layered organic material layer provided between the bottom electrode and the top electrode,
wherein the top electrode is a metal electrode including Ag,
wherein the top electrode includes an exposure portion where the organic material layer or the bottom electrode is exposed, and the exposure portion is provided as one or more exposure portion, and
wherein a thickness of the top electrode in at least one region of an edge of the exposure portion is 110% or more of a thickness of the top electrode in a non-exposure portion.

2. The organic light emitting device of claim 1, wherein the exposure portion is provided by removing one region of the top electrode.

3. The organic light emitting device of claim 1, wherein a content of Ag in the top electrode is 90 wt % or more of a total weight of the top electrode.

4. The organic light emitting device of claim 1, wherein a region corresponding to the exposure portion is electrically cut off.

5. The organic light emitting device of claim 1, wherein a maximum diameter of the exposure portion is 500 nm or more and 1 mm or less.

6. The organic light emitting device of claim 1, wherein a maximum diameter of the bottom electrode exposed by the exposure portion is 200 nm or more and 200 μm or less.

7. A display device including the organic light emitting device of claim 1.

8. A lighting device including the organic light emitting device of claim 1.

9. The organic light emitting device of claim 1, wherein at least one region of the organic material layer in the exposure portion is removed.

10. The organic light emitting device of claim 9, wherein a region corresponding to an area smaller than an area of the exposure portion is removed from the organic material layer in the exposure portion.

11. The organic light emitting device of claim 9, wherein a thickness of the organic material layer in the exposure portion outside the removed region is 110% or more of a thickness of the organic material layer in a region outside the exposure portion.

12. A method of manufacturing an organic light emitting device, the method comprising:
preparing a bottom electrode;
forming a one or more-layered organic material layer on the bottom electrode;
forming a top electrode on the organic material layer; and
connecting the bottom electrode and the top electrode to an external power source and applying a reverse voltage to remove one or more regions of the top electrode including a short circuit defect region to form an exposure portion,
wherein the top electrode comprises a metal electrode including Ag, and
wherein the reverse voltage is a voltage between a breakdown voltage of the organic material layer in the short circuit defect region and a breakdown voltage of the organic material layer in a normal region.

13. The method of claim 12, wherein the reverse voltage is 18 V or more.

14. The method of claim 12, wherein the reverse voltage is a reverse pulse voltage.

15. The method of claim 14, wherein a pulse width of the reverse pulse voltage is 10 ns or more and 10 ms or less.

16. The method of claim 14, wherein a pulse frequency of the reverse pulse voltage is 100 Hz or more and 100 MHz or less.

17. The method of claim 14, wherein the reverse pulse voltage is repeatedly applied 100 times or more.

18. The method of claim 14, wherein the reverse pulse voltage is a voltage where a maximum voltage increases sequentially.

19. A method of repairing an organic light emitting device, the method comprising:
preparing an organic light emitting device including a bottom electrode, a top electrode provided opposite to the bottom electrode, and a one or more-layered organic material layer provided between the bottom electrode and the top electrode, the top electrode being a metal electrode including Ag;
connecting an external power source to the organic light emitting device; and
applying a reverse voltage to the organic light emitting device to remove one or more regions of the top electrode including a short circuit defect region to form an exposure portion,
wherein the reverse voltage is a voltage between a breakdown voltage of the organic material layer in the short circuit defect region and a breakdown voltage of the organic material layer in a normal region.

20. The method of claim 19, wherein the reverse voltage is 18 V or more.

21. The method of claim 19, wherein the reverse voltage is a reverse pulse voltage.

22. The method of claim 21, wherein the reverse pulse voltage is repeatedly applied 100 times or more.

23. The method of claim 21, wherein the reverse pulse voltage is a voltage where a maximum voltage increases sequentially.

24. The method of claim 21, wherein a pulse frequency of the reverse pulse voltage is 100 Hz or more and 100 MHz or less.

25. The method of claim 24, wherein a pulse width of the reverse pulse voltage is 10 ns or more and 10 ms or less.

\* \* \* \* \*